US010481972B1

United States Patent
Lebedev et al.

(10) Patent No.: US 10,481,972 B1
(45) Date of Patent: Nov. 19, 2019

(54) FILE VERIFICATION USING CYCLIC REDUNDANCY CHECK

(71) Applicant: Google LLC, Mountain View, CA (US)

(72) Inventors: Andre Lebedev, Brooklyn, NY (US); Christian Eric Schrock, Cold Spring Harbor, NY (US)

(73) Assignee: Google LLC, Mountain View, CA (US)

( * ) Notice: Subject to any disclaimer, the term of this patent is extended or adjusted under 35 U.S.C. 154(b) by 95 days.

(21) Appl. No.: 15/895,718

(22) Filed: Feb. 13, 2018

Related U.S. Application Data

(63) Continuation of application No. 14/822,407, filed on Aug. 10, 2015, now abandoned.

(51) Int. Cl.
| | | |
|---|---|---|
| *G06F 11/10* | (2006.01) | |
| *G06F 11/07* | (2006.01) | |
| *H03M 13/09* | (2006.01) | |
| *H03M 13/15* | (2006.01) | |
| *H03M 13/29* | (2006.01) | |

(52) U.S. Cl.
CPC ...... *G06F 11/1004* (2013.01); *G06F 11/0727* (2013.01); *H03M 13/096* (2013.01); *H03M 13/1515* (2013.01); *H03M 13/29* (2013.01)

(58) Field of Classification Search
CPC ............ G06F 11/1004; G06F 11/0727; H03M 13/096; H03M 13/1515; H03M 13/29
See application file for complete search history.

(56) References Cited

U.S. PATENT DOCUMENTS

| | | | |
|---|---|---|---|
| 6,259,367 B1 | 7/2001 | Klein | |
| 6,446,235 B1 | 9/2002 | Drottar et al. | |
| 8,321,850 B2 | 11/2012 | Bruening et al. | |
| 8,601,339 B1 * | 12/2013 | Cypher | H03M 13/2918 714/752 |
| 8,601,473 B1 | 12/2013 | Aron et al. | |

(Continued)

OTHER PUBLICATIONS

Plank, James S. Optimizing Cauchy Reed-Solomon Codes for Fault-Tolerant Storage Applications. Technical Report CS-05-569 Department of Computer Science University of Tennessee. Dec. 2005. Retrieved from internet: <http://www.cs.utk.edu/'plank/plank/papers/CS-05-659.html>.

(Continued)

*Primary Examiner* — Kyle Vallecillo
(74) *Attorney, Agent, or Firm* — Lerner, David, Littenberg, Krumholz & Mentlik, LLP

(57) ABSTRACT

A system and method are provided for verifying and reconstructing a file using cyclic redundancy checks (CRCs). A writer client sends a file, which includes data chunks including one or more data blocks, and code chunks including one or more code blocks. One or more storage devices store the packets underlying the one or more data blocks and their respective packet CRCs. A curator server stores a first CRC for each complete data chunk and each complete code chunk and determines that an incomplete code chunk has one or more missing code blocks. The curator server generates a second CRC for each of the complete data chunks and the complete code chunks using the packet CRCs, and compares the generated second CRCs with the respective stored first CRCs. The curator server generates a missing chunk CRC for the incomplete code chunk using the packet CRCs.

20 Claims, 7 Drawing Sheets

(56) References Cited

U.S. PATENT DOCUMENTS

| | | | | |
|---|---|---|---|---|
| 8,621,317 B1* | 12/2013 | Cypher | ............ | H03M 13/2927 714/755 |
| 8,856,619 B1* | 10/2014 | Cypher | ............... | G06F 11/1044 714/6.2 |
| 2003/0093633 A1* | 5/2003 | Thiesfeld | ........... | G11B 20/1816 711/154 |
| 2003/0097628 A1 | 5/2003 | Ngo et al. | | |
| 2006/0195759 A1 | 8/2006 | Bower | | |
| 2006/0212782 A1 | 9/2006 | Li | | |
| 2007/0105608 A1* | 5/2007 | Dransfield | ............. | G07F 17/32 463/13 |
| 2008/0126842 A1 | 5/2008 | Jacobson et al. | | |
| 2008/0165795 A1* | 7/2008 | Baruch | .................. | H04L 49/90 370/421 |
| 2008/0259844 A1* | 10/2008 | Richeson | ............. | H04M 11/002 370/328 |
| 2009/0183056 A1* | 7/2009 | Aston | ................. | G06F 11/1004 714/799 |
| 2010/0218037 A1 | 8/2010 | Swartz et al. | | |
| 2011/0307447 A1* | 12/2011 | Sabaa | ................ | H04L 67/2842 707/637 |
| 2011/0307659 A1* | 12/2011 | Hans | ..................... | G06F 3/0613 711/114 |
| 2013/0007333 A1 | 1/2013 | Fai et al. | | |
| 2013/0007562 A1 | 1/2013 | Fai et al. | | |
| 2013/0007823 A1 | 1/2013 | Mangs et al. | | |
| 2013/0198151 A1 | 8/2013 | Sentinelli et al. | | |
| 2013/0318051 A1* | 11/2013 | Kumar | ................ | G06F 16/1748 707/692 |
| 2014/0115182 A1* | 4/2014 | Sabaa | ................. | H04L 67/1097 709/232 |
| 2014/0344649 A1 | 11/2014 | Caillerie et al. | | |
| 2016/0092137 A1 | 3/2016 | Doerk et al. | | |
| 2018/0081754 A1* | 3/2018 | Berman | ............. | G06F 11/1068 |

OTHER PUBLICATIONS

Rizzo, Luigi, "Effective Erasure Codes for Reliable Computer Communication Protocols", ACM Computer Communications Review. vol. 27 n. 2. Apr. 1997. pp. 24-36.

Yanlin Li et al., "VIPER: Verifying the Integrity of PERipherals' Firmware", CCS 2011 Proceedings of the 18th ACM conference on Computer and communications security pp. 3-16.

Stone et al., "Performance of Checksums and CRCs over Real Data", IEEE/ACM Transactions on Networking (TON), vol. 6 Issue 5, Oct. 1998, pp. 529-543.

Zhiqiang Ma, Eric, "Colossus: Successor to the Google File System (GFS)", Highly Scalable Systems Nov. 29, 2012.

* cited by examiner

FILE VERIFICATION USING CYCLIC REDUNDANCY CHECK

CROSS-REFERENCE TO RELATED APPLICATIONS

The present application is a continuation of U.S. patent application Ser. No. 14/822,407, filed on Aug. 10, 2015, the disclosure of which is incorporated herein by reference.

BACKGROUND

Cauchy-Reed-Solomon codes are an effective way to store large volumes of data with small overhead in capacity. In a distributed file system, constituent data and code blocks of such a file are stored on different machines, and each block is protected by a checksum of its contents. This checksum is kept by a server that stores the block and in metadata kept by the server. This allows the checksum to be verified when a block is copied to a different machine either directly or through reconstruction. Typically, a writer of the file will compute checksums of each block as well as the checksum of the entire file, and will preserve these values on the server when the file gets closed.

Frequently files that are encoded using Cauchy-Reed-Solomon encoding need to be brought to full replication or verified before checksums of all constituent blocks are known. Such is the case when the writer process dies or loses network connection to remote blocks and the server. In this case the file system must compute checksums of the file and the constituent blocks, and verify that all surviving blocks are consistent with the underlying encoding matrix.

BRIEF SUMMARY

A cyclic redundancy check (CRC) of each code block packet can be computed from CRCs of data block packets. Furthermore, CRC of the code block is computed from CRCs of block packets that are XORed after getting extended by an appropriate number of zeroes. Similarly, CRCs of data blocks can be used to compute CRC of an entire file, by XORing the CRCs after extending each CRC by an appropriate number of zeroes. This avoids the undesirable reading of contents of all surviving blocks, computing missing blocks, and then computing checksums of all blocks, which translates to bandwidth, memory, and CPU cost.

In order to compute and verify checksums of all blocks in Cauchy-Reed-Solomon encoding, it is sufficient to have each machine that stores a block send CRCs of the underlying packets. If each block is 1 MB long, and requires 4 packets to encode it, the server that needs to verify CRCs needs to fetch four 32-bit integers from each machine, achieving reduction of data transfer, memory requirement, and the number of XORs by a few orders of magnitude.

One aspect of the disclosure provides a method. According to the method, a plurality of chunks written to a memory are identified, the plurality of chunks including data chunks and code chunks, each of the plurality of chunks including one or more blocks. It is determined whether one or more of the identified code chunks is missing one or more of its blocks, and if a code chunk is missing one or more of its blocks, checksums of packets underlying one or more data blocks are requested. The checksums of the packets underlying the one or more data blocks are received from one or more storage devices, and used to computed the checksum for the chunk that includes the one or more missing blocks using the received checksums of the packets.

Another aspect of the disclosure provides a system, including a memory storing a plurality of chunks, the plurality of chunks including data chunks and code chunks, each of the plurality of chunks including one or more blocks, and one or more processors in communication with the memory. The one or more processors are configured to identify a plurality of chunks written to a memory, the plurality of chunks including data chunks and code chunks, each of the plurality of chunks including one or more blocks, and determine whether one or more of the identified code chunks is missing one or more of its blocks. If a code chunk is missing one or more of its blocks, the one or more processors are further configured to request checksums of packets underlying one or more data blocks, receive, from one or more storage devices in response to the request, the checksums of the packets underlying the one or more data blocks, and compute the checksum for the chunk that includes the one or more missing blocks using the received checksums of the packets.

Yet another aspect of the disclosure provides a system, including a writer client, a curator server in communication with the writer client, the curator server configured to receive and store data from the writer client, and one or more storage devices in communication with the writer client and the curator servers, each of the one or more storage devices storing packets underlying the data written from the client device to the curator server. The curator server is configured to detect whether some of the stored data is corrupt. In response to detecting corruption, the curator server requests information associated with the packets underlying the data from the one or more storage devices, and upon receipt of the information associated with the packets underlying the data from the one or more storage devices, determines an extent of the data corruption. Depending on the extent of the data corruption, the curator server reconstructs and computes checksums for the corrupt data.

DETAILED DESCRIPTION

Figure 1:
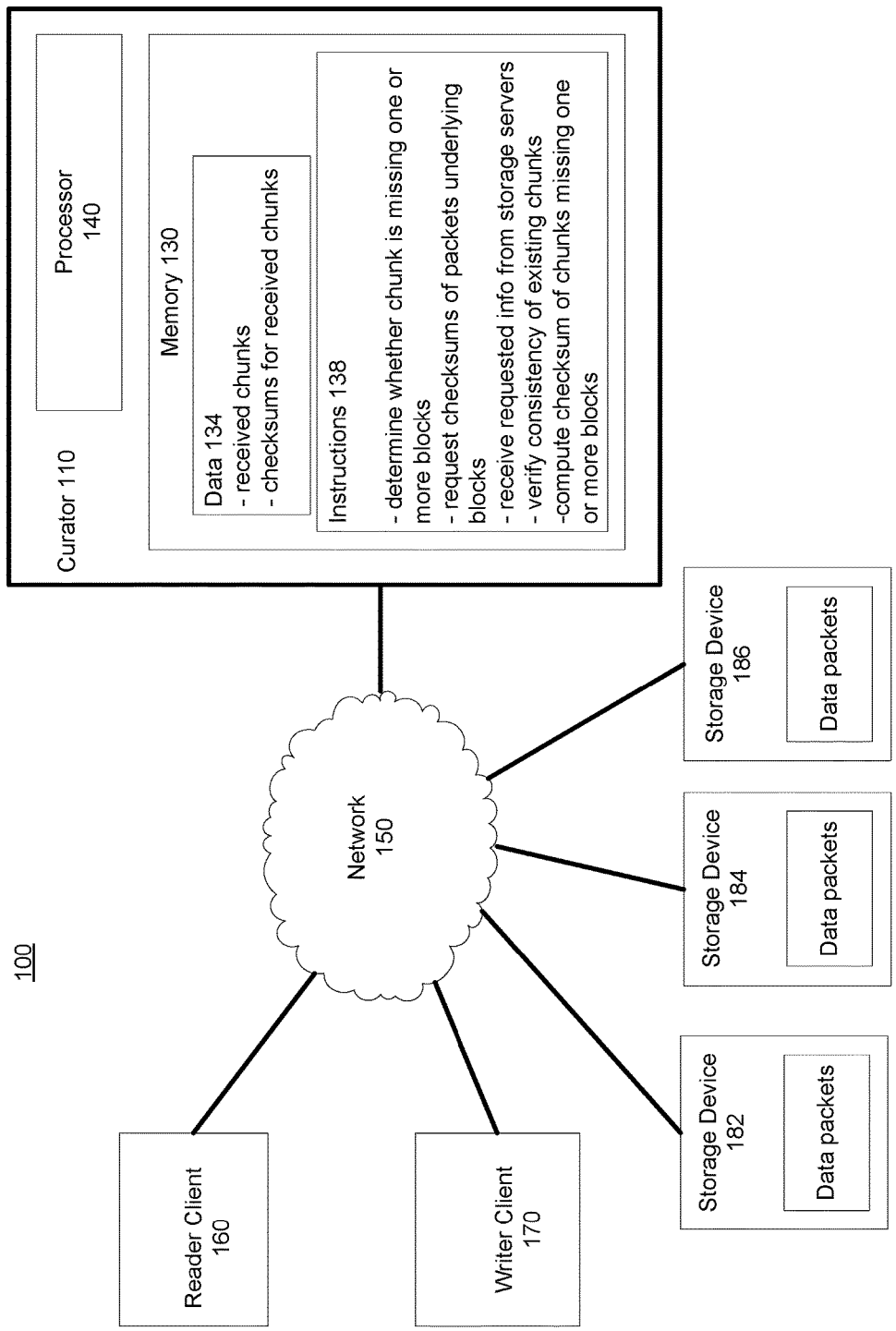
FIG. 1 is a block diagram of an example system according to aspects of the disclosure.

The present disclosure relates to computing checksums for blocks of data and code written to a file encoded with Cauchy-Reed-Solomon algorithm in a distributed file system. Blocks, as referenced herein, can be data or code, and have checksums which cover them. A server responsible for maintaining metadata about the blocks, called the curator, maintains checksums of every block of the file. In the event a given block is missing, for example as a result of corruption, a server crash, or other event, the checksum will be missing and must be reconstructed in order to be able to detect data corruption. If a sufficient number of blocks survive, the curator server can obtain the necessary information from connected storage servers and compute the missing checksum. This computation can be performed efficiently, without requiring the curator to read the contents of all surviving chunks.

In order to encode a file with Cauchy-Reed-Solomon algorithm, the contents of the file are segmented into data blocks (for example, 1 MB in size). Every N data blocks are grouped to compute K code blocks which protect the data. In order to compute the code blocks, each data block is divided into a number of field packets of equal size. The number of field packets is determined by the sum of N and K: the number of packets must be sufficiently high in order to be able to construct a mixing matrix which determines how code blocks are computed from data blocks. As long as at least N blocks survive (either data or code), the missing blocks, may be computed by inverting the mixing matrix.

In some examples, rather than reconstructing the missing blocks, a checksum for the missing block or for a chunk including the missing block is computed using information corresponding to the data chunks. For example, the checksum for the missing code chunk may be computed using checksums of data packets corresponding to the data chunks. Checksums of the data chunks may be calculated using, for example, a cyclic redundancy check (CRC). A CRC of each code packet can be computed from the CRCs of data packets. Additionally, a CRC of the missing code chunk can be computed from the CRCs of data packets that are zero-padded to a predetermined length and then put into an XOR operation. Further, CRCs of data chunks can be used to compute a CRC of an entire file. For example, the CRCs of the data chunks can be zero-padded and input to an XOR operation.

To compute a checksum for a missing code block or for an entire chunk, each storage server storing data blocks can send a checksum of the packets underlying one or more data blocks. The curator server uses the checksums of the underlying packets to verify the chunks that exist. For example, the curator can match the received checksums against those computed for the existing chunks to determine if they are consistent. If the existing chunks are verified, the curator server uses the received checksums to compute a checksum for the missing block. Alternatively or additionally, the curator server uses the received checksums to compute a checksum for the chunk that includes the missing block. If the existing chunks are not verified, the curator server may send another request for information to the storage servers.

By computing the missing checksum for the chunk including the missing block using the checksums of underlying data packets, the curator server only needs to fetch a limited amount of information from the storage servers. Accordingly, resources are conserved by limiting data transfer, reducing required memory, and limiting a required number of computations.

FIG. 1 illustrates an example system 100, in which a plurality of computing devices are communicatively coupled, for example, through network 150. The plurality of computing devices may include servers, clients, or other computing devices. In this example, server 110 operates as a curator, while storage devices 182-186 may be storage servers or other storage devices. Client devices 160, 170 may be computing devices capable of reading data from and writing data to the curator server 110.

The writer client 170 writes data to the curator server 110, which is read by reader client 160. The data written to the curator 110 may be stored as a file including a plurality of chunks, with each chunk including one or more blocks. The file includes a predetermined number of data chunks and a predetermined number of code chunks. By way of example only, five data chunks may have three corresponding code chunks. Each chunk has a checksum, and each block in the chunk has a separate checksum. The checksums are used, for example, to ensure that the data has been validly written. The file also has a checksum.

The curator server 110 determines whether a chunk, or one or more blocks within a chunk, is missing. For example, information written by the writer client 170 may have been corrupted if there was an unexpected shutdown or other failure. In this case, checksums for the missing blocks, the chunk including the missing block, and the file cannot be computed. If a chunk or multiple chunks are missing one or more blocks, the curator requests information from the storage devices 182-186. The storage devices 182-186 provide checksums for data packets underlying blocks in the file. The curator 110 uses the packet checksums to calculate checksums for the missing blocks, the chunks including the missing blocks, and/or the file. In some instances, the curator uses the received packet checksums to reconstruct the chunk having the missing block. By using the packet checksums, the missing checksum may be computed without requiring a full read of data and code chunk siblings.

In some examples, the network 150 may be a datacenter, a load-balanced server farm, or any other type of computing environment, including a backplane of interconnected peripherals or a system of components on a motherboard. The network 150, and intervening nodes, may comprise various configurations and protocols including the Internet, World Wide Web, intranets, virtual private networks, wide area networks, local networks, private networks using communication protocols proprietary to one or more companies, Ethernet, WiFi (such as 802.11, 802.11b, g, n, or other such standards), and HTTP, and various combinations of the foregoing.

The curator server 110 may be any type of virtualized or non-virtualized computing device or system of computing devices capable of communicating over a network. Server 110 can contain one or more processors 140, memory 130 and other components typically present in general purpose computing devices. The memory 130 can store information accessible by the one or more processors 140, including instructions 138 that can be executed by the one or more processors 140.

Memory 130 can also include data 134 that can be retrieved, manipulated or stored by the processor 140. The memory can be of any non-transitory type capable of storing information accessible by the processor, such as a hard-drive, memory card, RAM, DVD, write-capable, etc.

The instructions 138 can be any set of instructions to be executed directly, such as machine code, or indirectly, such as scripts, by the one or more processors. In that regard, the terms "instructions," "applications," "steps" and "programs" can be used interchangeably herein. The instructions can be stored in object code format for direct processing by a processor, or in any other computing device language including scripts or collections of independent source code modules that are interpreted on demand or compiled in advance. Functions, methods and routines of the instructions are explained in more detail below.

Data 134 can be retrieved, stored or modified by the one or more processors 140 in accordance with the instructions 138. In one example, the data 134 may include chunks of a file written by the writer client 170, and checksums for the written chunks. Although the subject matter described herein is not limited by any particular data structure, the data can be stored in internal or external memory, computer registers, in a relational database as a table having many different fields and records, or XML documents. The data can also be formatted in any computing device-readable format such as, but not limited to, binary values, ASCII or Unicode. Moreover, the data can comprise any information sufficient to identify the relevant information, such as numbers, descriptive text, proprietary codes, pointers, references to data stored in other memories such as at other network locations, or information that is used by a function to calculate the relevant data.

The one or more processors 140 can be any conventional processors, such as commercially available CPUs. Alternatively, the processors can be dedicated components such as an application specific integrated circuit ("ASIC") or other hardware-based processor. Although not necessary, the server 110 may include specialized hardware components to perform specific computing processes.

Although FIG. 1 functionally illustrates the processor, memory, and other elements of computing device 110 as being within the same block, the processor, computer, computing device, or memory can actually comprise multiple processors, computers, computing devices, or memories that may or may not be stored within the same physical housing. For example, the memory can be a hard drive or other storage media located in housings different from that of the computing devices 110. Accordingly, references to a processor, computer, computing device, or memory will be understood to include references to a collection of processors, computers, computing devices, or memories that may or may not operate in parallel. For example, the computing devices 110 may include server computing devices operating as a load-balanced server farm, distributed system, etc. Yet further, although some functions described below are indicated as taking place on a single computing device having a single processor, various aspects of the subject matter described herein can be implemented by a plurality of computing devices, for example, communicating information over the network 150.

The storage devices 182-186 may be configured similarly to the curator server 110, including one or more processors and memories. The memories for each storage device 182-186 may include data packets corresponding to the data blocks in the file.

Reader client 160 and writer client 170 may also include one or more processors and memory, including data and instructions, as described above. In other examples, the reader client 160 and writer client 170 may have a different computing infrastructure. In some examples, the reader client 160 and/or writer client 170 may be a personal computing device having all of the components normally used in connection with a personal computing device, such as a central processing unit (CPU), memory (e.g., RAM and internal hard drives) storing data and instructions, a display (e.g., a monitor having a screen, a touch-screen, a projector, a television, or other device that is operable to display information), user input device (e.g., a mouse, keyboard, touch-screen or microphone), and all of the components used for connecting these elements to one another.

Although only a few computing devices are depicted in FIG. 1, it should be appreciated that a typical system can include a large number of connected computing devices, with each different computing device being at a different node of the network 150.

Figure 2:
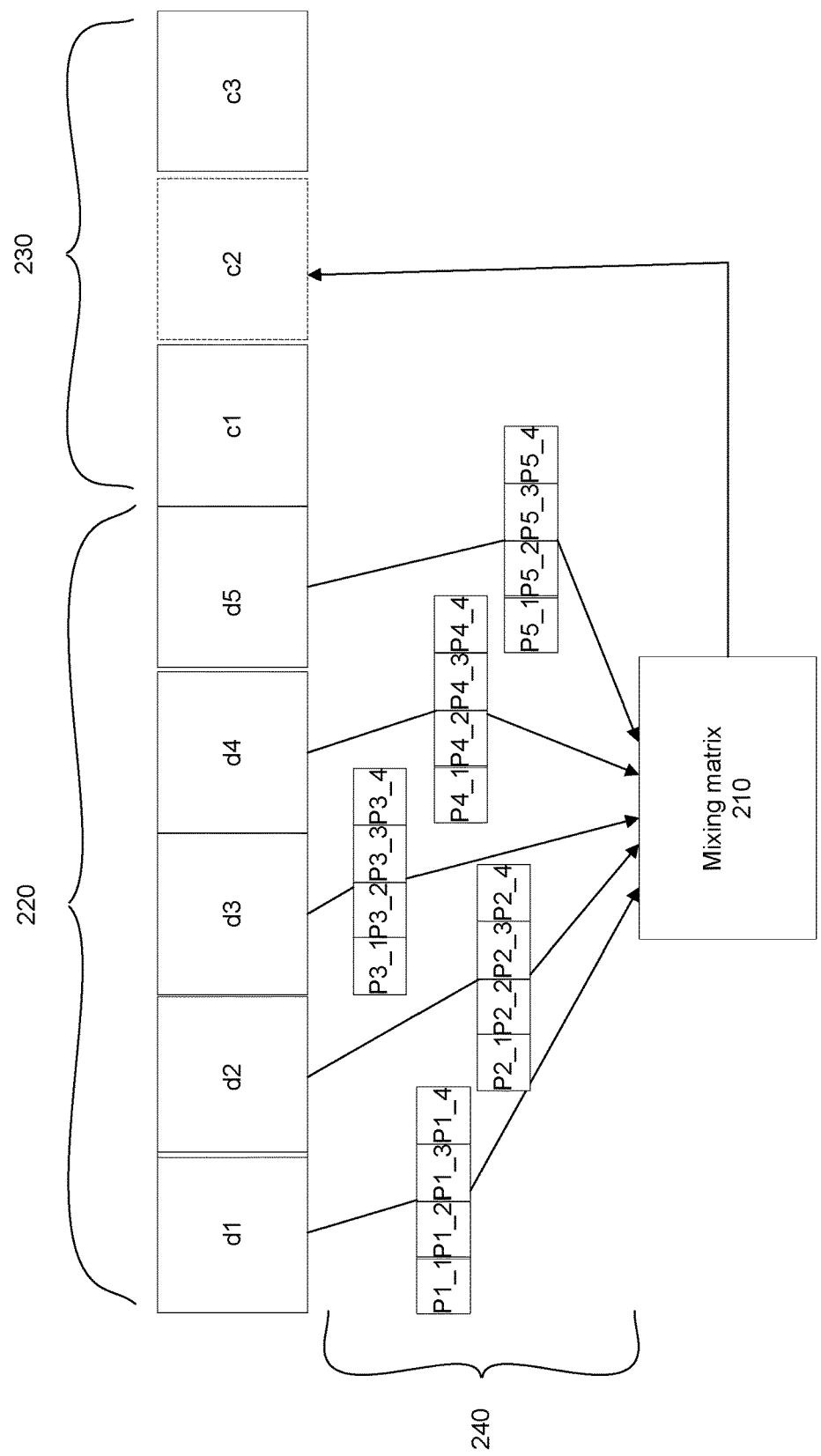
FIG. 2 is an example functional diagram illustrating an example of providing information for packets underlying blocks according to aspects of the disclosure.

FIG. 2 provides an example of computing code blocks using information associated with data blocks. Data blocks 220 (d1-d5) may be used to compute code blocks 230 (c1-c3). Each of the blocks d1-d5 and c1-c3 may be part of chunks which make up a file. While only a few blocks are shown, each chunk may include one or more blocks, and thus a number of additional blocks may be included in the file. Moreover, the data blocks which are used to generate the code blocks need not be part of a same row in the file. For example, different data blocks (not shown) from different rows of different chunks may be used. In the Cauchy-Reed-Solomon algorithm, different packets of all data blocks are XORed to obtain one quantum of each code block.

A mixing matrix 210 determines how packets 240 of data blocks 220 are mixed to obtain code blocks 230. In the example of FIG. 2, code block c2 is missing. An inverted part of the mixing matrix 210 may be used to determine how to mix packets 240 of arbitrary blocks to compute the missing block c2. For example, appropriate packets may be XOR'd to compute one quantum of the desired code or data block. Expressed mathematically, for data blocks $d\_1$ through $d\_D$, each block will be split into a number of packets P of equal length, producing data packets $d\_11$ through $d\_DP$. Each code block packet $c\_ij = d\_ly \hat{} \ldots \hat{} d\_Dx$, where x and y refer to indices of data chunk packets, and where inclusion of data packets is prescribed by the mixing matrix. For example, for 2 data chunks and 1 code chunk with 2 packets per quantum, each quantum will look like:

$$d\_11 \ d\_21 \ | \ c\_11$$

$$d\_12 \ d\_22 \ | \ c\_12$$

The mixing matrix will prescribe how the code block packets are computed so that any missing chunk could be recovered. For example:

$$c\_11 = d\_11 \hat{} d\_22$$

$$c\_12 = d\_12 \hat{} d\_21$$

results in a good prescription. If data chunk 1 is missing, then it can be computed as:

$$d\_11 = c11 = \hat{} d\_22$$

$$d\_12 = c12 \hat{} d\_21$$

Similar equations can be obtained for recovery of chunk 2 if it is missing. In more complex codes having a larger number of chunks, packets are mixed in appropriate schemes so that the least number of XOR operations is required to compute any one missing chunk, and all code packets will be unique.

A checksum of data may be computed, for example, using cyclic redundancy check (CRC). When CRC is computed without preconditioning or postconditioning, then CRC $(A \rightarrow B) = CRC(A) \rightarrow CRC(B)$, where A and B are data buffers that may or may not have the same length. Splitting each buffer into packets of equal length, buf=ABCD. Because, $0 \hat{} A = A$, then $CRC(ABC) = CRC(A00 \hat{} 0B0 \hat{} 00C) = CRC(A00) \hat{} CRC(0B0) \hat{} CRC(00C)$, where 0 is a zero-filled buffer of the same length as each A, B, C. The unconditioned CRC of a zero-filled buffer is 0, thus $CRC(ABC) = CRC(A00) \hat{} CRC(B0) \hat{} CRC(C)$. A CRC may be extended by any number of zeroes, so essential constituent parts of CRC(ABC) are CRC(A), CRC(B), and CRC(C).

In view of the above, each code block packet can be computed from CRCs of data block packets 240. Furthermore, CRC of the code block c2 is computed from CRCs of block packets that are XORed after being extended by the appropriate number of zeroes. Similarly, CRCs of data blocks can be used to compute CRC of the entire file, by XORing the CRCs after extending each CRC by an appropriate number of zeroes.

Figure 3:
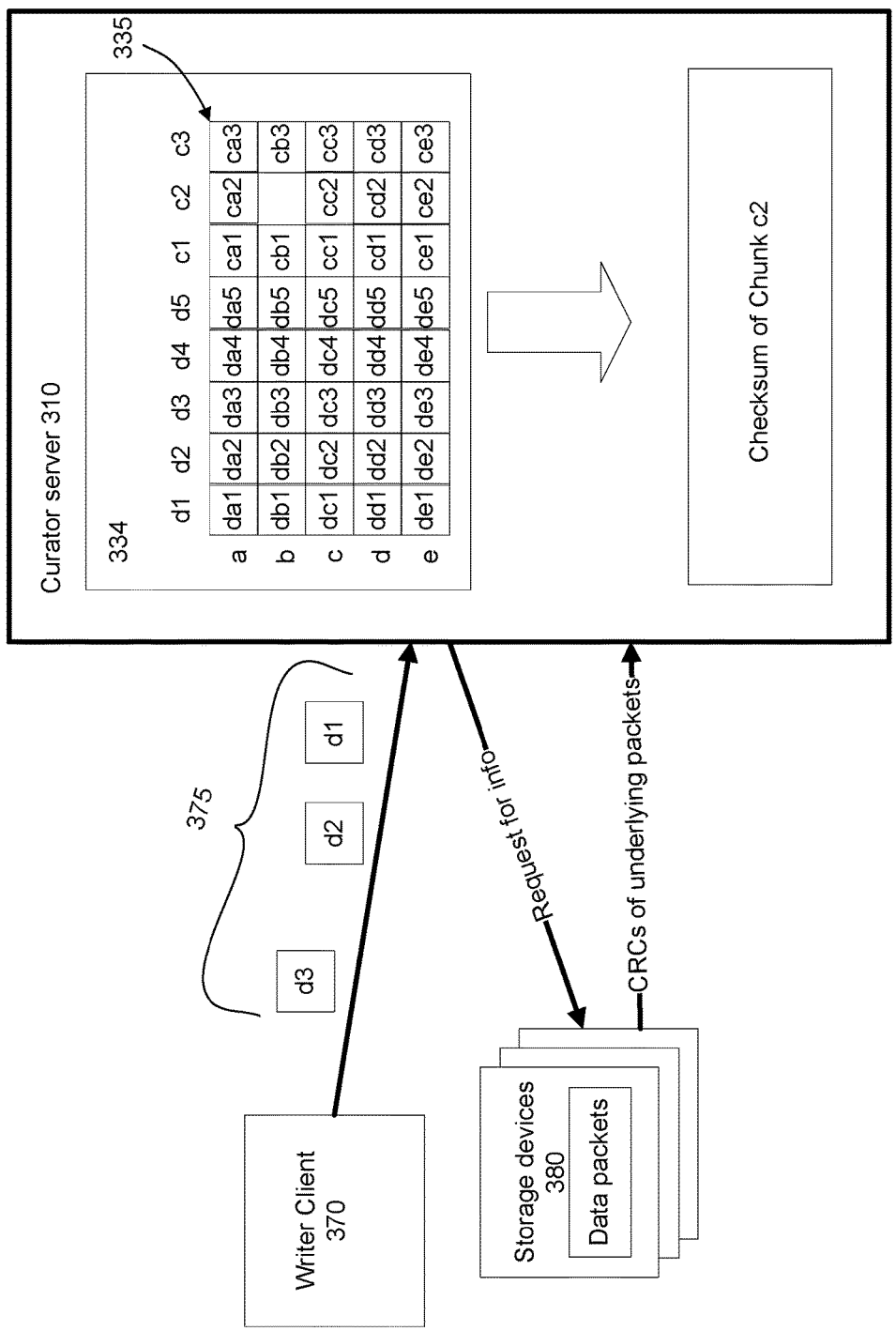
FIG. 3 is an example functional diagram illustrating computation of a checksum of a chunk missing one or more blocks according to aspects of the disclosure.

FIG. 3 illustrates an example of computing a checksum of a chunk missing one or more blocks. Writer client 370 writes data 375 to curator server 310. Curator server 310 stores the data 375 in memory 334 as a file 335. The file 335 is missing at least one block cb2 of chunk c2. Accordingly, the curator 310 does not have a checksum for the missing block cb2, the chunk c2, or the file 335. The curator server 310 sends a request for information to storage devices 380, which store blocks of the file 335. Each machine 380 that stores a block sends CRCs of the underlying packets. The curator uses the received CRCs of the underlying packets to compute a checksum for the entire chunk c2.

In some examples, the curator server 310 may determine for which blocks the underlying packet checksums are needed to compute the missing checksum for the incomplete chunk. In other examples the storage devices 380 may determine which packet checksums are necessary. In further examples, the storage devices 380 may provide packet checksums for packets underlying all the data blocks in the file 335, and the curator 310 uses those necessary to compute the missing checksum.

Because, in the example above, the checksum for the chunk c2 can be computed using the underlying packets, the curator server 310 is not required to read the data blocks used to compute the checksum. As a result, data transfer is reduced, a memory requirement is reduced, and the number of XOR computations is reduced by a few orders of magnitude. For example, if each block is 1 MB long, and requires 4 packets to encode it, the server 310 that needs to verify CRCs needs to fetch four 32-bit integers from each machine 380, achieving reduction of data transfer, memory requirement, and the number of XORs by a few orders of magnitude.

Figure 4:
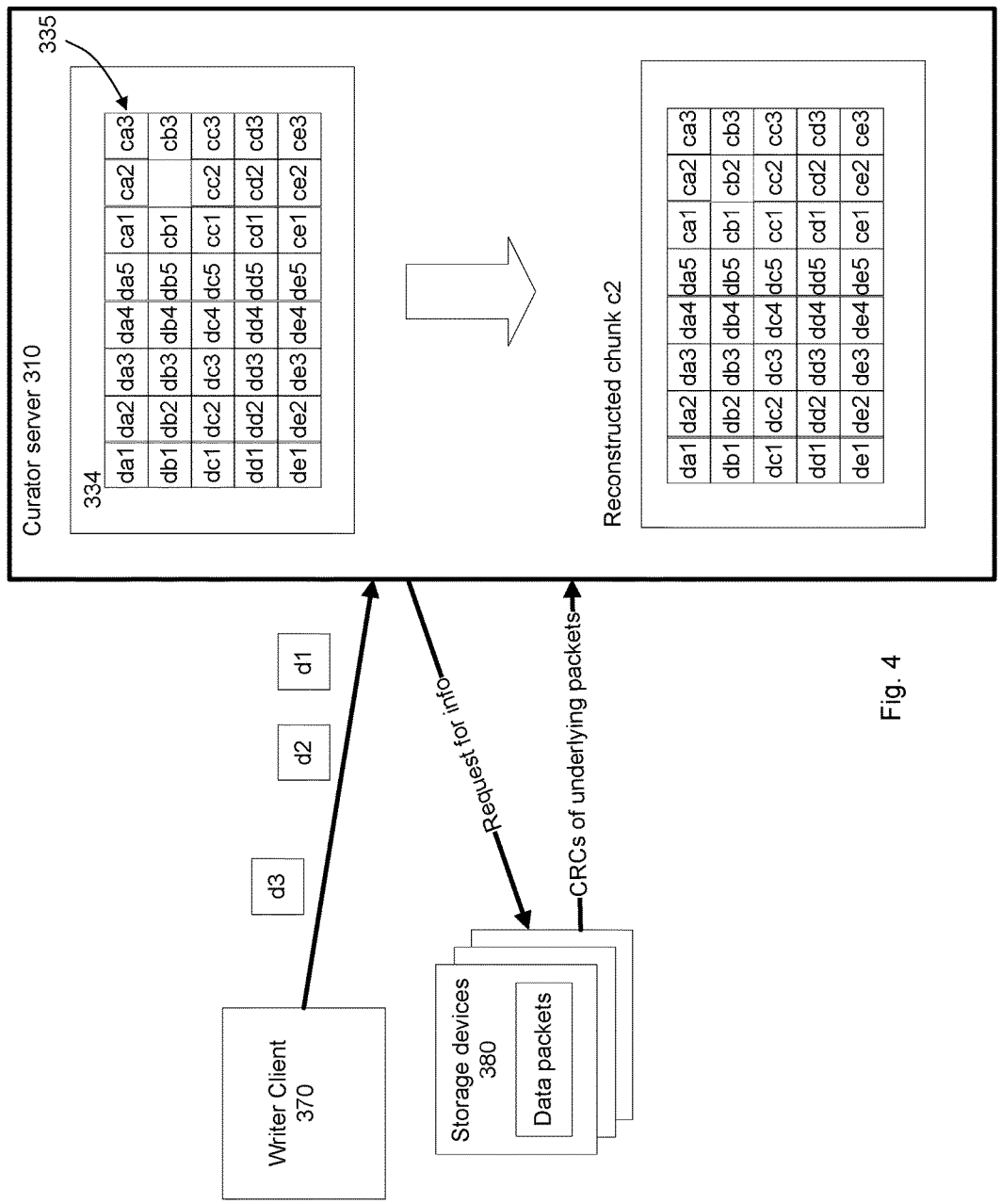
FIG. 4 is an example functional diagram illustrating reconstruction of the chunk missing one or more blocks according to aspects of the disclosure.

FIG. 4 illustrates an example of reconstructing a chunk missing one or more blocks. As shown in FIG. 4, the file includes chunks d1-d5 and c1-c3. Code chunk c2 is missing block cb2. Accordingly, the curator 310 requests information from the storage devices 380, which provide the checksums of underlying data packets. The curator uses these packet checksums to reconstruct the missing block cb2, and thus the chunk c2. Accordingly, the file 335 is then a complete file, enabling checksums for the chunk and the file to be computed.

Figure 5:
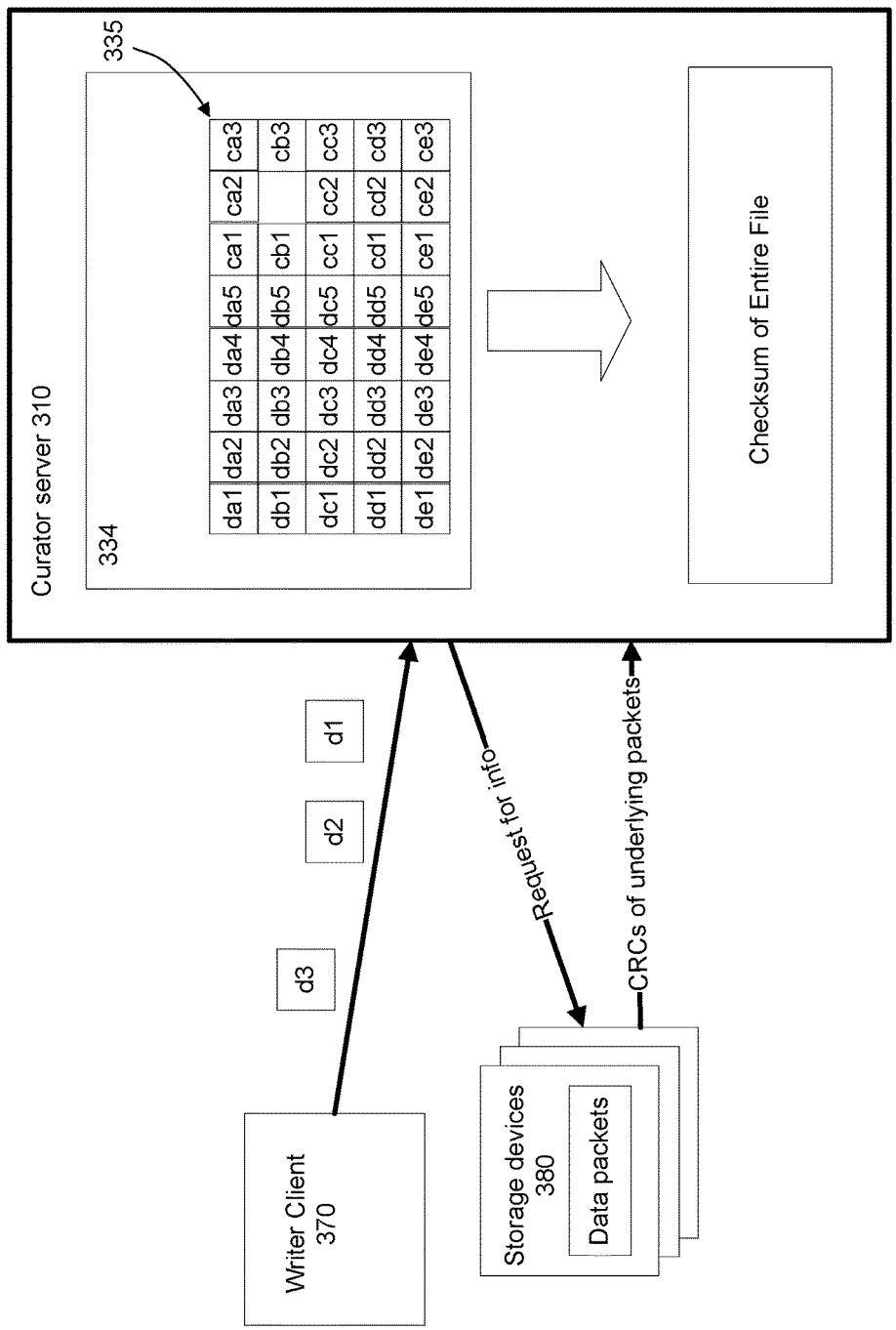
FIG. 5 is an example functional diagram illustrating computation of a checksum of a file including a chunk missing one or more blocks according to aspects of the disclosure.

FIG. 5 illustrates an example of generating a checksum of a file having one or more missing blocks. Similar to the examples above, the curator 310 stores file 335 having one or more chunks with missing blocks. For example, the curator 310 may determine that the blocks are missing when attempting to compute checksums for the chunks and file based on the data blocks. Accordingly, the curator 310 requests information from the storage devices 380 and receives checksums of data packets. The curator 310 uses the received packet checksums to compute the checksum for the entire file.

In each of the examples of FIGS. 3-5 above, the curator 310 may verify existing chunks using the received packet checksums, for example, prior to using the packet checksums to compute the missing checksum. For example, the curator 310 may store checksums for existing complete code chunks c1 and c3. Upon receipt of the packet checksums from the storage devices 180, the curator 310 may use the received packet checksums to compute checksums for chunks c1 and c3. The curator 310 may compare the stored checksums to the computed checksums for chunks c1 and c3. If there is a match, the curator may determine that the existing chunks are verified, and therefore continue to compute the missing checksums. However, if the stored and compute checksums do not match, the curator 310 may take another action, such as requesting that the writer client 370 resend some or all of the data 375.

While in the examples above only one code block was missing, the checksums of packets underlying blocks stored in the storage devices may be used to reconstruct and compute the checksum for chunks missing a plurality of blocks. Moreover, the packet checksums can be used to compute checksums for multiple chunks having missing blocks.

Figure 6:
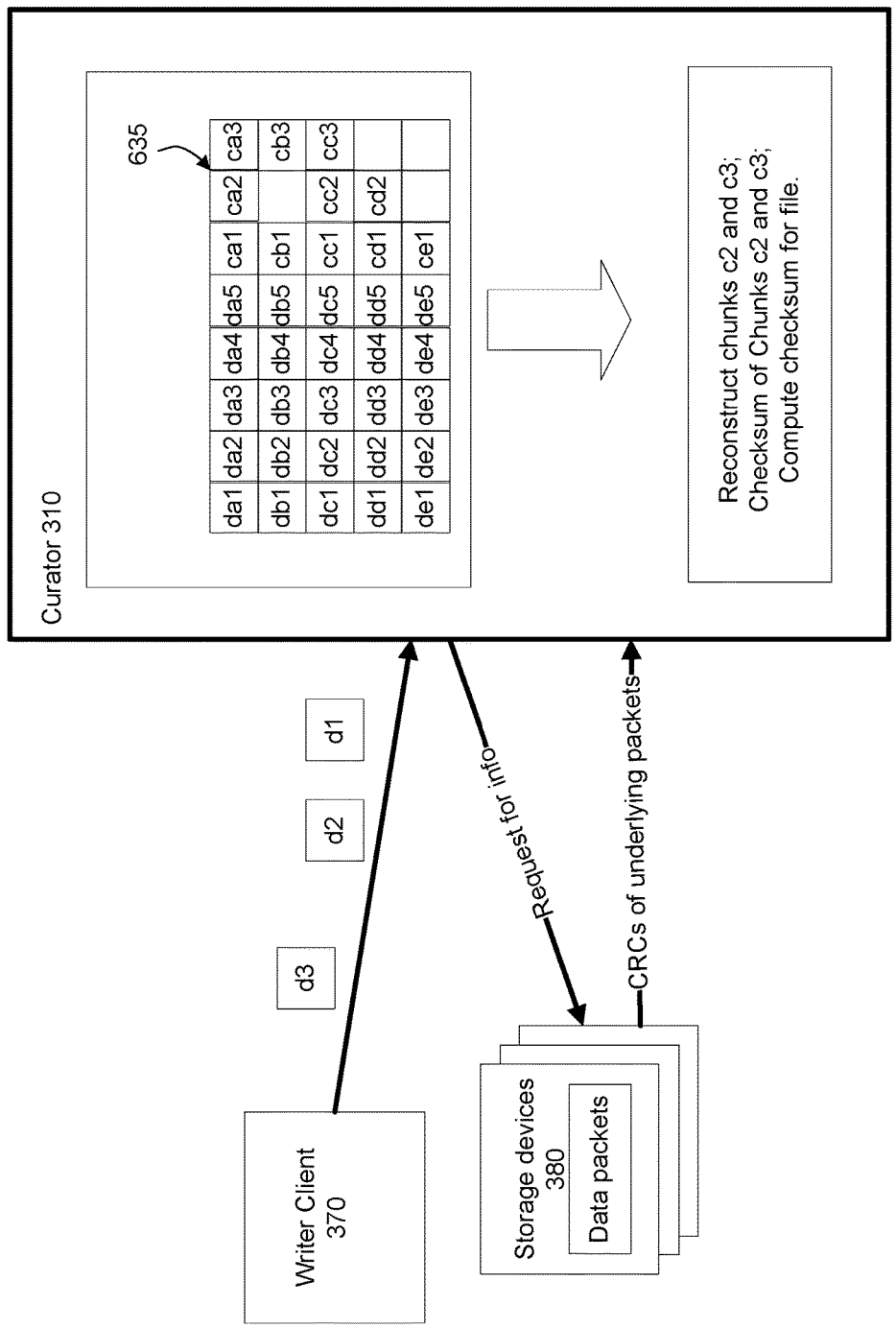
FIG. 6 is another example functional diagram illustrating computation of a missing checksum according to aspects of the disclosure.

As shown in FIG. 6, for example, the file 635 is missing multiple blocks in chunk c2 and in chunk c3. However, as described in the examples above, the curator server 310 may request information from the storage devices 380, which supply checksums of underlying data packets. These packet checksums may be used to compute the checksums for both chunks c2 and c3. The packet checksums may also be used to reconstruct missing blocks ca2, ce2, cd3, and ce3. Further, the received packet checksums may be used to compute the checksum for the file 635.

Figure 7:
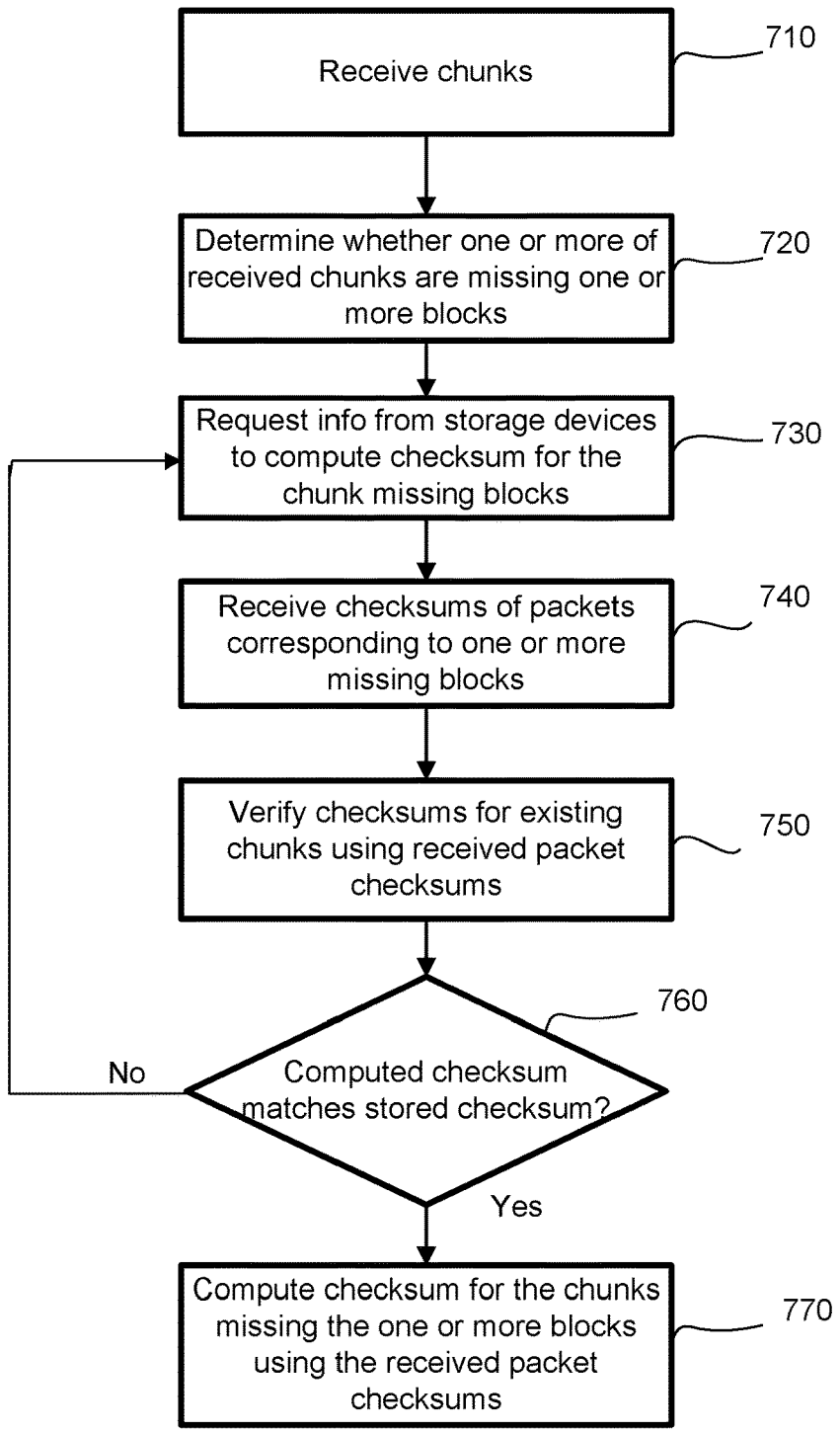
FIG. 7 is an example method according to aspects of the disclosure.

FIG. 7 illustrates a method 700 for efficiently computing missing checksums. The method 700 may be performed, for example, by a curator server in a network. It should be understood that the following operations do not have to be performed in the precise order described below. Rather, various operations can be handled in a different order or simultaneously, and operations may also be added or omitted.

In block 710, chunks are received and written to memory. The received chunks may be data written by, for example, a writer client. The chunks may be part of a file, and may include a predetermined number of data chunks and a predetermined number of corresponding code chunks. Each chunk may include one or more blocks.

In block 720, it is determined whether one or more blocks of the identified chunks are missing. For example, blocks may be missing as a result of a writing error, an unexpected shutdown, or some other corruption or shutdown. As a result of the missing one or more blocks, a checksum for the chunk including the missing blocks will also be missing. Moreover, a checksum for the file will also be missing.

In block 730, information is requested from one or more storage devices for computing the missing checksums. In some examples, the request may identify which blocks are missing, or which chunks include the missing blocks.

In block 740, in response to the request, checksums of packets underlying the data blocks in the file are received from the one or more storage devices.

In block 750, checksums for existing chunks are verified using the received packet checksums. For example, for chunks in the file that are not missing one or more blocks, a checksum may have been computed and stored when the chunks were written. A checksum for an existing chunk may be computed using the received packet checksums, and the stored checksum may be compared to the computed checksum. If the two match (block 760), the existing chunks are verified. In this regard, it is ensured that the existing chunks have not been corrupted. However, if the stored checksum does not match the computed checksum using the received packet checksums, the method may return to, for example, block 730 or block 710.

In block 770, the received packet checksums are used to compute missing checksums for the chunks having one or more missing blocks. In some examples, the received packet checksums may be used to reconstruct those chunks, or to compute a checksum for the entire file.

The above described systems and methods may be advantageous in that they provide for efficiently computing missing checksums, without requiring reading of full data contents of associated blocks across the network. By calculating the missing checksum for a chunk using packet checksums of existing associated blocks, significant processing resources and time are conserved. Moreover, a possibility of persisting data corruption in a system is greatly reduced. For example, if bit corruption occurred along network routes or in the curator reconstructing the missing chunks, the bit corruption would be detected during the verification of the existing chunks.

While some of the examples above are described in connection with Cauchy-Reed-Solomon encoding, it should be understood that the system and method may be implemented using any of a variety of coding types. Accordingly, while in some examples the checksums are referred to as CRCs, any type of checksum may be used.

As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system, comprising:
a writer client configured to send a file, the file including data chunks and code chunks, each of the data chunks includes one or more data blocks, and each of the code chunks includes one or more code blocks;
one or more storage devices in communication with the writer client, the storage devices configured to store packets underlying the one or more data blocks;
a curator server in communication with the writer client and the storage devices, the curator server configured to:
store a first cyclic redundancy check (CRC) for each complete data chunk and each complete code chunk;
determine, based on the stored first CRCs, that an incomplete code chunk has one or more missing code blocks;
receive, from the storage devices, packet CRCs for the packets underlying the one or more data blocks;
generate, using the packet CRCs, a second CRC for each of the complete data chunks and each of the complete code chunks;
determine whether the generated second CRCs match the respective stored first CRCs for each of the complete data chunks and each of the complete code chunks; and
generate, using the packet CRCs, a missing chunk CRC for the incomplete code chunk when the generated second CRCs match the respective stored first CRCs for each of the complete data chunks and each of the complete code chunks.

2. The system of claim 1, wherein the curator server is further configured to:
request further information from one of the storage devices or the writer client when one or more of the generated second CRCs do not match the respective stored first CRCs.

3. The system of claim 1, wherein the curator server is further configured to:
generate the missing chunk CRC for the incomplete code chunk by zero-padding the packet CRCs and applying an exclusive OR operation on the zero-padded packet CRCs.

4. The system of claim 1, wherein the curator server is further configured to:
generate, using the packet CRCs, a missing block CRC for each of the one or more missing code blocks.

5. The system of claim 1, wherein the curator server is further configured to:
generate, using the packet CRCs, a missing file CRC for the file.

6. The system of claim 1, wherein the curator server is further configured to:
reconstruct, using the packet CRCs, the one or more missing code blocks.

7. The system of claim 1, wherein the curator server is further configured to:
reconstruct, using the packet CRCs, the incomplete code chunk.

8. The system of claim 1, wherein the curator server is further configured to:
reconstruct, using the packet CRCs, the file.

9. A curator server, comprising:
one or more memories;
one or more processors in communication with the one or more memories, the one or more processors configured to:
receive a file from a writer client, the file including data chunks and code chunks, each of the data chunks includes one or more data blocks, and each of the code chunks includes one or more code blocks;
store a first cyclic redundancy check (CRC) for each complete data chunk and each complete code chunk;
determine, based on the stored first CRCs, that an incomplete code chunk has one or more missing code blocks;
receive, from one or more storage devices, packet CRCs for packets underlying the one or more data blocks;
generate, using the packet CRCs, a second CRC for each of the complete data chunks and each of the complete code chunks;
determine whether the generated second CRCs match the respective stored first CRCs for each of the complete data chunks and each of the complete code chunks; and
generate, using the packet CRCs, a missing chunk CRC for the incomplete code chunk when the generated second CRCs match the respective stored first CRCs for each of the complete data chunks and each of the complete code chunks.

10. The curator server of claim 9, wherein the one or more processors is further configured to:
   request further information from one of the storage devices or the writer client when one or more of the generated second CRCs do not match the respective stored first CRCs.

11. The curator server of claim 9, wherein the one or more processors is further configured to:
   generate the missing chunk CRC for the incomplete code chunk by zero-padding the packet CRCs and applying an exclusive OR operation on the zero-padded packet CRCs.

12. The curator server of claim 9, wherein the one or more processors is further configured to:
   generate, using the packet CRCs, a missing file CRC for the file.

13. The curator server of claim 9, wherein the one or more processors is further configured to:
   reconstruct, using the packet CRCs, the incomplete code chunk.

14. The curator server of claim 9, wherein the one or more processors is further configured to:
   reconstruct, using the packet CRCs, the file.

15. A method, comprising:
   receiving a file from a writer client, the file including data chunks and code chunks, each of the data chunks includes one or more data blocks, and each of the code chunks includes one or more code blocks;
      storing a first cyclic redundancy check (CRC) for each complete data chunk and each complete code chunk;
      determining, based on the stored first CRCs, that an incomplete code chunk has one or more missing code blocks;
      receiving, from one or more storage devices, packet CRCs for packets underlying the one or more data blocks;
      generating, using the packet CRCs, a second CRC for each of the complete data chunks and each of the complete code chunks;
      determining whether the generated second CRCs match the respective stored first CRCs for each of the complete data chunks and each of the complete code chunks; and
      generating, using the packet CRCs, a missing chunk CRC for the incomplete code chunk when the generated second CRCs match the respective stored first CRCs for each of the complete data chunks and each of the complete code chunks.

16. The method of claim 15, further comprising:
   requesting further information from one of the storage devices or the writer client when one or more of the generated second CRCs do not match the respective stored first CRCs.

17. The method of claim 15, wherein the generating the missing chunk CRC for the incomplete code chunk further comprising:
   zero-padding the packet CRCs; and
   applying an exclusive OR operation on the zero-padded packet CRCs.

18. The method of claim 15, further comprising:
   generating, using the packet CRCs, a missing file CRC for the file.

19. The method of claim 15, further comprising:
   reconstructing, using the packet CRCs, the incomplete code chunk.

20. The method of claim 15, further comprising:
   reconstructing, using the packet CRCs, the file.

* * * * *